United States Patent
Ichikawa et al.

(10) Patent No.: US 8,154,178 B2
(45) Date of Patent: Apr. 10, 2012

(54) PIEZOELECTRIC FRAME SURROUNDING A PIEZOELECTRIC VIBRATING PIECE AND PACKAGE WITH EXHAUST CHANNEL

(75) Inventors: Ryoichi Ichikawa, Saitama (JP); Mitoshi Umeki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 457 days.

(21) Appl. No.: 12/510,085

(22) Filed: Jul. 27, 2009

(65) Prior Publication Data

US 2010/0033061 A1 Feb. 11, 2010

(30) Foreign Application Priority Data

Aug. 11, 2008 (JP) ................................. 2008-206881

(51) Int. Cl.
*H01L 41/08* (2006.01)
(52) U.S. Cl. ....................................... 310/344; 310/370
(58) Field of Classification Search .................. 310/344, 310/370
See application file for complete search history.

(56) References Cited

U.S. PATENT DOCUMENTS

| | | | |
|---|---|---|---|
| 7,518,291 B2 | 4/2009 | Tanaya | |
| 7,872,401 B2 * | 1/2011 | Onitsuka et al. | 310/344 |
| 8,018,126 B2 * | 9/2011 | Umeki et al. | 310/344 |
| 8,053,952 B2 * | 11/2011 | Takahashi | 310/344 |
| 8,053,957 B2 * | 11/2011 | Sugiyama | 310/370 |
| 8,058,778 B2 * | 11/2011 | Numata et al. | 310/344 |
| 8,063,542 B2 * | 11/2011 | Ono et al. | 310/348 |
| 8,069,543 B2 * | 12/2011 | Numata et al. | 29/25.35 |
| 2001/0017505 A1 * | 8/2001 | Aratake et al. | 310/340 |
| 2009/0015106 A1 * | 1/2009 | Tanaya | 310/344 |
| 2010/0079040 A1 * | 4/2010 | Iwai et al. | 310/370 |
| 2010/0084086 A1 * | 4/2010 | Ichikawa et al. | 156/250 |
| 2010/0133958 A1 * | 6/2010 | Umeki et al. | 310/364 |
| 2010/0148634 A1 * | 6/2010 | Ichikawa | 310/348 |
| 2010/0156246 A1 * | 6/2010 | Iwai | 310/344 |
| 2010/0201221 A1 * | 8/2010 | Inoue et al. | 310/312 |
| 2011/0050045 A1 * | 3/2011 | Aratake et al. | 310/344 |
| 2011/0062831 A1 * | 3/2011 | Amano et al. | 310/370 |
| 2011/0140794 A1 * | 6/2011 | Fukuda | 331/158 |

(Continued)

FOREIGN PATENT DOCUMENTS

JP 07-106905 4/1995
(Continued)

OTHER PUBLICATIONS

Office action issued in corresponding JP Application No. 2008-206881.

*Primary Examiner* — Jaydi San Martin
(74) *Attorney, Agent, or Firm* — Klarquist Sparkman, LLP

(57) ABSTRACT

In the disclosed piezoelectric devices a piezoelectric frame includes a vibrating piece. An excitation electrode is formed on the vibrating piece. An outer frame portion surrounds the vibrating piece and includes an extraction electrode connected to the excitation electrode. A package base is bonded to one surface of the outer frame portion and includes a connection electrode connected to the extraction electrode. The package base includes an external terminal formed on a surface thereof opposite the surface on which the connection electrodes are formed. Through-hole conductors connected the connection electrodes with respective external terminals. A lid is bonded to an opposing surface of the piezoelectric frame. An exhaust channel is in communication with the extraction electrode adjacent the through-hole conductors.

20 Claims, 7 Drawing Sheets

U.S. PATENT DOCUMENTS

2011/0140796 A1 * 6/2011 Fukuda .................. 331/158

FOREIGN PATENT DOCUMENTS

| JP | 2004-056760 | | | 2/2004 |
| JP | 2004208237 | A | * | 7/2004 |
| JP | 2005-278069 | | | 10/2005 |
| JP | 2006-042096 | | | 2/2006 |
| JP | 2007-049434 | | | 2/2007 |
| JP | 2007-096945 | | | 4/2007 |
| JP | 2010187054 | A | * | 8/2010 |

* cited by examiner

PIEZOELECTRIC FRAME SURROUNDING A PIEZOELECTRIC VIBRATING PIECE AND PACKAGE WITH EXHAUST CHANNEL

CROSS-REFERENCE TO RELATED APPLICATION

This application claims priority to and the benefit of Japan Patent Application No. 2008-206881, filed on Aug. 11, 2008, in the Japan Patent Office, the disclosure of which is incorporated herein by reference in its entirety.

FIELD

This disclosure pertains to, inter alia, piezoelectric devices manufactured by arranging a piezoelectric vibrating piece inside a package.

DESCRIPTION OF THE RELATED ART

Piezoelectric devices such as piezoelectric vibrators or oscillators are widely used in small information devices, mobile phones, or mobile communication apparatus or piezoelectric gyro-sensors. With the progress of miniaturization and/or increases in the operating frequency of mobile communication apparatus, piezoelectric oscillators used in this equipment must be progressively smaller and/or operate at higher frequency.

Certain conventional piezoelectric vibrators are manufactured by enclosing a piezoelectric vibrating piece inside a package. The package comprises a package body and a lid. The package body is made up of a package base and a frame bonded to the package base and surrounding the piezoelectric vibrating piece. The lid and package base comprise metal, glass, or a ceramic material. The frame and piezoelectric vibrating piece are made of a piezoelectric material. The lid is bonded to the package body by applying a brazing filler metal on a bonding surface of the package body. After establishing (via a through-hole) a vacuum state or atmosphere of inert gas inside the package, a sealing material is introduced into the through-hole to seal the interior of the package and maintain the vacuum or inert-gas atmosphere therein. The sealing material is applied by heat-melting.

The through-holes extend through the bottom of a concavity of the package body or package base. The through-holes are not the same as other through-holes typically used for routing electrical connections from electrodes on the piezoelectric vibrating piece to the exterior of the package. A piezoelectric vibrator made in such a manner is discussed in Japan Unexamined Patent Application Nos. 2004-056760 and 2006-042096.

Piezoelectric vibrators comprising alumina-ceramic packages are currently made one-by-one by arranging an individual piezoelectric vibrating piece inside the package body. Although the package can be made thin, the package is not suitable for mass-production. Also, as the piezoelectric vibrating devices are miniaturized further, arranging individual piezoelectric vibrating pieces in respective packages becomes progressively more difficult.

U.S. Pat. No. 7,518,291 discusses methods for manufacturing a piezoelectric vibrating piece. The methods include plasma-mediated surface-activation bonding. The plasma-mediated surface-activation bonding is performed on metal surfaces or metal membranes of a crystal base, on crystal vibrating pieces including respective frames, and on crystal lids. However, in order to activate metal surfaces by a plasma, the metals must be situated in a vacuum environment, and any vacuum devices for the activation must be prepared. Additionally, since the package base, crystal vibrating piece (with outer frame portion), and lid of each device must be positioned relative to each other while in the vacuum environment, special devices are required to perform the positioning.

In addition, during conventional use of a sealing material for sealing holes or the like, the sealing material is heated to a melt temperature, which causes the sealing material to generate one or more gases. Because of the configuration and use of the through-holes on conventional piezoelectric devices, some of the gas is disadvantageously left inside the package after sealing. This residual gas may adversely affect the long-term stability of the piezoelectric vibrator.

In view of the foregoing, this invention provides, inter alia, piezoelectric devices that can be manufactured by bonding together a package base, a crystal vibrating piece (with outer frame portion), and a lid in the ambient atmosphere, while leaving substantially no gas inside the package generated from molten sealing material. Thus, after sealing, the package interior remains indefinitely at a desired vacuum level or desired environment of inert gas after completing manufacturing.

SUMMARY

This invention encompasses several aspects, among which piezoelectric devices are provided having features that overcome shortcomings of the prior art summarized above. An embodiment according to this aspect comprises a frame (made of a piezoelectric material) including a piezoelectric vibrating piece and an outer frame portion, a package base, and a lid. The piezoelectric vibrating piece includes at least one excitation electrode. The outer frame portion surrounds the vibrating piece, includes first and second surfaces, and includes at least one extraction electrode connected to a respective excitation electrode on the piezoelectric vibrating piece. The package base, bonded to the second surface of the outer frame portion, includes at least one connection electrode connected to a respective extraction electrode. The package base also includes at least one external electrode (also called "external terminal") located on an outer surface of the package base and connected to a respective connection electrode via a respective through-hole in the package base. More specifically, the through-hole includes a respective through-hole conductor that connects the respective connection electrode to the respective external electrode. The lid is bonded to the first surface of the outer frame portion.

An exhaust channel is located at a respective extraction electrode adjacent the through-hole conductor. Thus, the exhaust channel is in communication with the extraction electrode and through-hole. During manufacture, the at least one through-hole (and respective conductor) is sealed using a molten eutectic material. But, due to the presence of the exhaust channel(s), the sealing is performed in way allowing the interior of the package (containing the piezoelectric vibrating piece) to be evacuated to a desired vacuum level or provided with a desired inert-gas atmosphere before completion of sealing. Thus, piezoelectric devices are provided having long-term stability.

In another embodiment of a piezoelectric device the exhaust channel opens to the space between the piezoelectric vibrating piece and the outer frame portion. This configuration allows communication of the through-holes with the interior of the piezoelectric device during sealing and other manufacturing steps.

In another embodiment of a piezoelectric device, the connection electrode is located on a step feature situated on the interior-facing surface of the package base. The step feature has a lower elevation than the portion of the interior-facing surface that is bonded to the second surface of the outer frame portion. The exhaust channel opens into a region in which connection electrodes are not present, thereby allowing communication, via the through-holes, to the interior space inside the package during sealing and other manufacturing steps.

Yet another embodiment of a piezoelectric device comprises a frame that includes an outer frame portion surrounding a piezoelectric vibrating piece attached thereto. On the piezoelectric vibrating piece is an excitation electrode. The outer frame portion includes an extraction electrode connected to the excitation electrode. A package base is bonded to a first surface of the outer frame portion and includes a connection electrode connected to the extraction electrode. The package base includes an external terminal on an exterior surface thereof, opposite the surface on which the connection electrode is present. A through-hole extends through the package base and connects the connection electrode to the external terminal by a through-hole conductor. A lid is bonded to a second surface of the outer frame portion. An exhaust channel opens to the extraction electrode adjacent the through-hole conductor and to the through-hole. Hence, the through-hole and interior of the piezoelectric device remain in communication with each other until completion of sealing of the through-hole conductor in the through-hole.

Sealing is achieved using a molten sealing material, such as a eutectic material initially applied as a metal ball and heated in situ to a melting temperature. Since communication persists to completion of sealing, it is possible to obtain, in a predictable and consistent manner, a desired vacuum level or amount of inert gas inside the package. This configuration provides a piezoelectric device exhibiting long-term stability.

In yet another embodiment the package base includes a concavity on its interior-facing surface to prevent the arms of the piezoelectric vibrating piece from touching the package base. An exhaust channel opens to the concavity, allowing communication of the through-hole with the interior of the piezoelectric device during manufacture.

A piezoelectric device according to yet another embodiment comprises a frame including a piezoelectric vibrating piece and an outer frame portion surrounding the piezoelectric vibrating piece. An excitation electrode is formed on the vibrating piece, and an extraction electrode is formed on the outer frame portion and connected to the excitation electrode. The outer frame portion has first and second surfaces. A package base has an inner surface that is attached to the first surface and that includes a connection electrode connected to the extraction electrode. The package base also has an outer surface (under-surface of the piezoelectric device) that includes an external terminal. The package base defines a through-hole containing a conductor connecting the connection electrode to the external terminal. The piezoelectric device also includes a lid bonded to the second surface of the outer frame portion. The device also includes a channel, of which a first portion opens to the extraction electrode adjacent the through-hole and a second portion opens to the connection electrode connected to the through-hole conductor. The first and second channel portions are formed on the frame and the package base. This allows the through-hole to communicate with the interior of the piezoelectric device as the through-hole conductor is being sealed by a sealing material, such as a eutectic metal ball. Consequently, the piezoelectric device may be sealed by the sealing material while maintaining a desired vacuum level or inert-gas atmosphere inside the package.

In various embodiments, the excitation electrode, extraction electrode, and connection electrode comprise a gold (Au) layer formed on a foundation layer comprising chrome or nickel. The lid can be made of a piezoelectric or glass material.

The various embodiments provide piezoelectric devices having long-term stability without producing variability in their vibrational frequency.

DETAILED DESCRIPTION

First Embodiment of Piezoelectric Device

Figure 1:
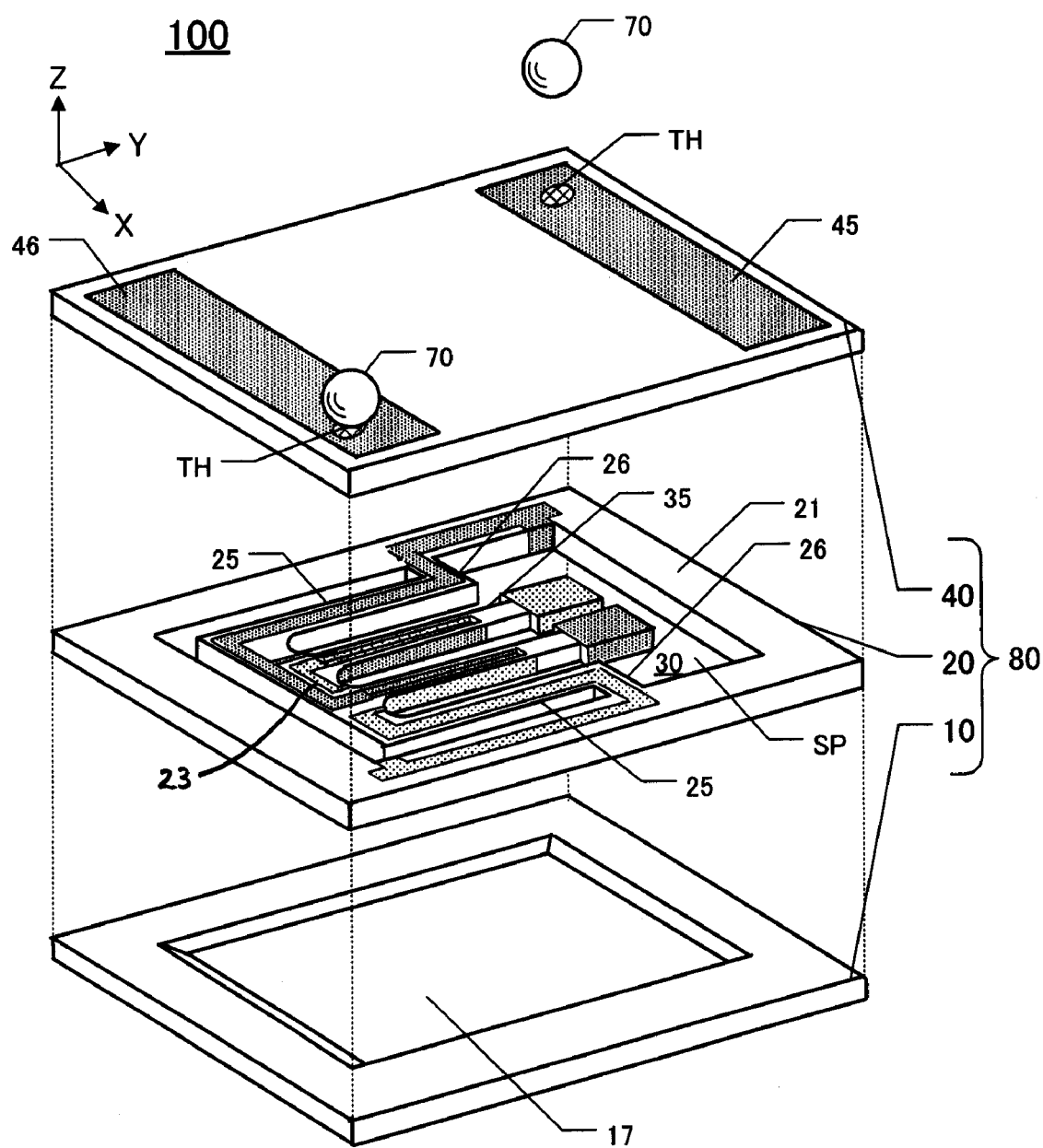
FIG. 1 is a perspective "exploded" view of a first embodiment of a piezoelectric device, in which the package base is shown uppermost for processing purposes.

FIG. 1 is a schematic "exploded" perspective view of a first embodiment of a piezoelectric device 100. The view in FIG. 1 is an upside-down view, with a package base 40 (normally the lower-most package component) being shown uppermost. The device 100 comprises a tuning-fork type crystal vibrating piece 30, formed by etching and attached to a frame 20. The frame 20 and crystal vibrating piece 30 desirably are integral components made of the same material (e.g., piezoelectric quartz crystal or other piezoelectric material). The device 100 also comprises a lid 10 (normally topmost in the device) and a package base 40 (normally lower-most in the device). The lid 10 and package base 40 can be made of a crystal material such as crystalline quartz or other suitable material. The lid 10, package base 40, and frame 20 collectively constitute a package enclosing the tuning-fork type crystal vibrating piece 30.

The frame 20 with tuning-fork type crystal vibrating piece 30 are sandwiched between the package base 40 and lid 10. In other words, the lid 10 is bonded to an upper surface (e.g., first surface) of the frame 20, and the package base 40 is bonded to a lower surface (e.g., second surface) of the frame 20. The lid 10 and package base 40 desirably are bonded to the frame 20 by siloxane bonding (Si—O—Si), which can be performed at room temperature. The lid 10 desirably has a concavity 17 that faces the crystal vibrating piece 30. Similarly, the package base 40 has a concavity 47 that faces the crystal vibrating piece 30. The concavities 17, 47 prevent the crystal vibrating piece from contacting the lid or package base.

The frame 20 includes the tuning-fork type crystal vibrating piece 30 located centrally thereon, and an outer frame portion 21 surrounding the crystal vibrating piece. A space SP is defined between the tuning-fork type crystal vibrating piece 30 and the outer frame portion 21. The outer frame portion 21 surrounds a base 23 and vibrating arms 35 of the tuning-fork type crystal vibrating piece 30. The base 23 is connected to the outer frame portion 21 by connecting portions 26 extending from respective supporting arms 25 (connected to the base 23) to form the frame 20. The space SP that defines the profile outline of the tuning-fork crystal vibrating piece 30 is formed by wet etching. The thickness of the tuning-fork type crystal vibrating piece 30 desirably is the same as of the outer frame portion 21.

The piezoelectric device 100 is made as follows. The lid 10 and package base 40 are bonded to the opposing first and second surfaces of the frame 20 by siloxane bonding to form a package 80. The package base 40 defines through-holes TH that extend through the thickness dimension of the package base. A respective eutectic metal ball 70 is placed on each through-hole while the package 80 is upside down. Thus, during manufacture the eutectic metal balls 70 extend upward from their respective through-holes TH. While in this position the eutectic metal balls 70 are heated to a specified melt temperature in a vacuum-reflow furnace to seal the through-holes. Each eutectic metal ball 70 is made of one of the following: gold-germanium (Au12Ge) alloy, gold-silicon (Au3.15Si) alloy, gold-tin (Au20Sn) alloy, or gold-germanium-tin (Au15Ge15Si) alloy. Melting the eutectic metal balls 70 renders them capable of entering and filling the respective through-holes TH.

In FIG. 1 the piezoelectric device 100 comprises one lid 10, one frame 20, and one package base 40 that are placed relative to each other and bonded by siloxane bonding. However, in an actual manufacturing process, thousands of frames 20, lids 10, and package bases 40 are formed on respective wafers or other substrates, and the wafers are layered and bonded together to produce hundreds to thousands of piezoelectric devices simultaneously.

Package Base of First Embodiment

Figure 2A:
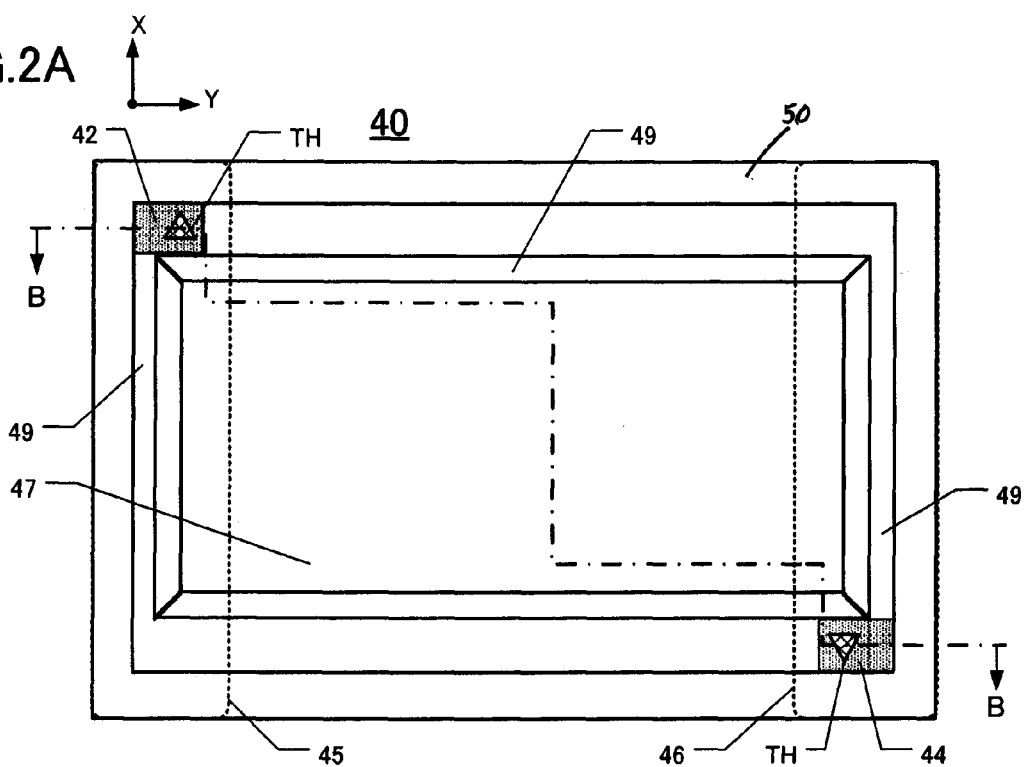
FIG. 2A is a top view of the package base in the first embodiment.
Figure 2B:
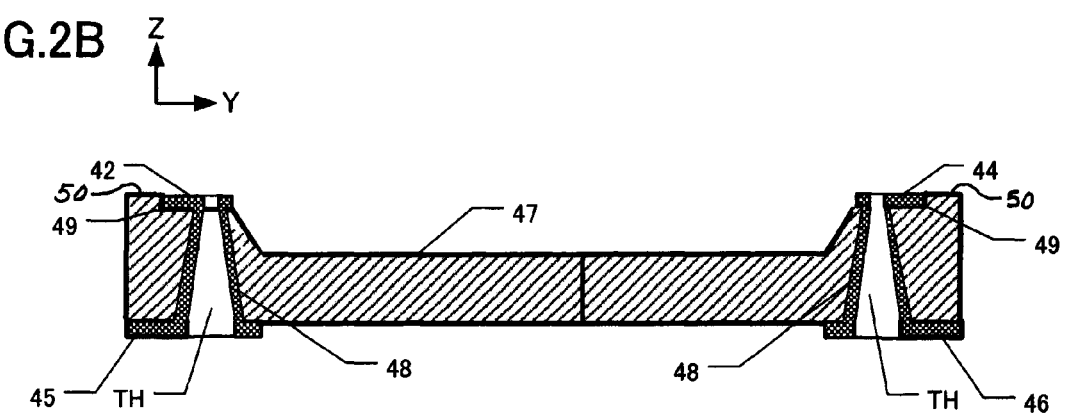
FIG. 2B is a cross-sectional view along the line B-B in FIG. 2A.

FIG. 2A is a plan (top) view of the package base 40, and FIG. 2B is a cross-sectional view along the line B-B in FIG. 2A. The package base 40 of this embodiment is made of Z-cut crystal. As shown in FIGS. 2A and 2B, a concavity 47 is defined in the package base on the surface thereof facing the frame 20 so as to prevent the interior surface of the package base 40 from touching the tuning-fork type crystal vibrating piece 30 inside the package 80. The concavity 47 is surrounded by a step 49 having an elevation greater than of the concavity but less than of the peripheral surface 50 of the package base 40. On respective locations on the step 49 are a first connection electrode 42 and a second connection electrode 44. The first and second connection electrodes 42, 44 have respective heights (thicknesses) in the range of 200 to 3000 Ångstroms, for example. Absence of the step 49 could cause a bonding failure when the peripheral surface 40 and outer frame portion 21 are being bonded together by siloxane bonding (Si—O—Si). The step 49 has a depth typically in the range of 150 to 2000 Ångstroms, for example, to accommodate the connection electrodes 42, 44.

The through-holes TH passing through the thickness dimension (Z direction) of the package base 40 open to the step 49. The through-holes TH desirably are formed by wet-etching. Through-hole conductors 48 are formed on the interior walls of the through-holes TH. The first connection electrode 42 and the second connection electrode 44, connected to respective through-holes TH, are formed on the step 49. Hence, the through-holes TH open to the first and second connection electrodes, respectively. On the under-surface (outer surface) of the package base 40 are a first external electrode 45 and a second external electrode 46. The through-holes TH also open to the first and second external electrodes, respectively.

The first connection electrode 42 and second connection electrode 44, the through-holes 48, and the first external electrode 45 and second external electrode 46 desirably are all formed simultaneously by sputtering or vacuum deposition. These electrodes desirably each comprise a gold layer on a foundation layer made of nickel or chrome.

The through-holes TH, as formed by wet-etching, have hexagonal transverse profiles at their lower ends and rectangular transverse profiles at their upper ends. (The upper ends are nearer the frame 20, and the lower ends are nearer the outside of the package 80.)

The first connection electrode 42 is electrically connected to the first external electrode 45 on the package base 40 via the through-hole conductor 48 in the respective through-hole TH. The second connection electrode 44 is electrically connected to the second external electrode 46 on the base 40 via the through-hole conductor 48 in the respective through-hole TH.

Frame of First Embodiment

Figure 3A:
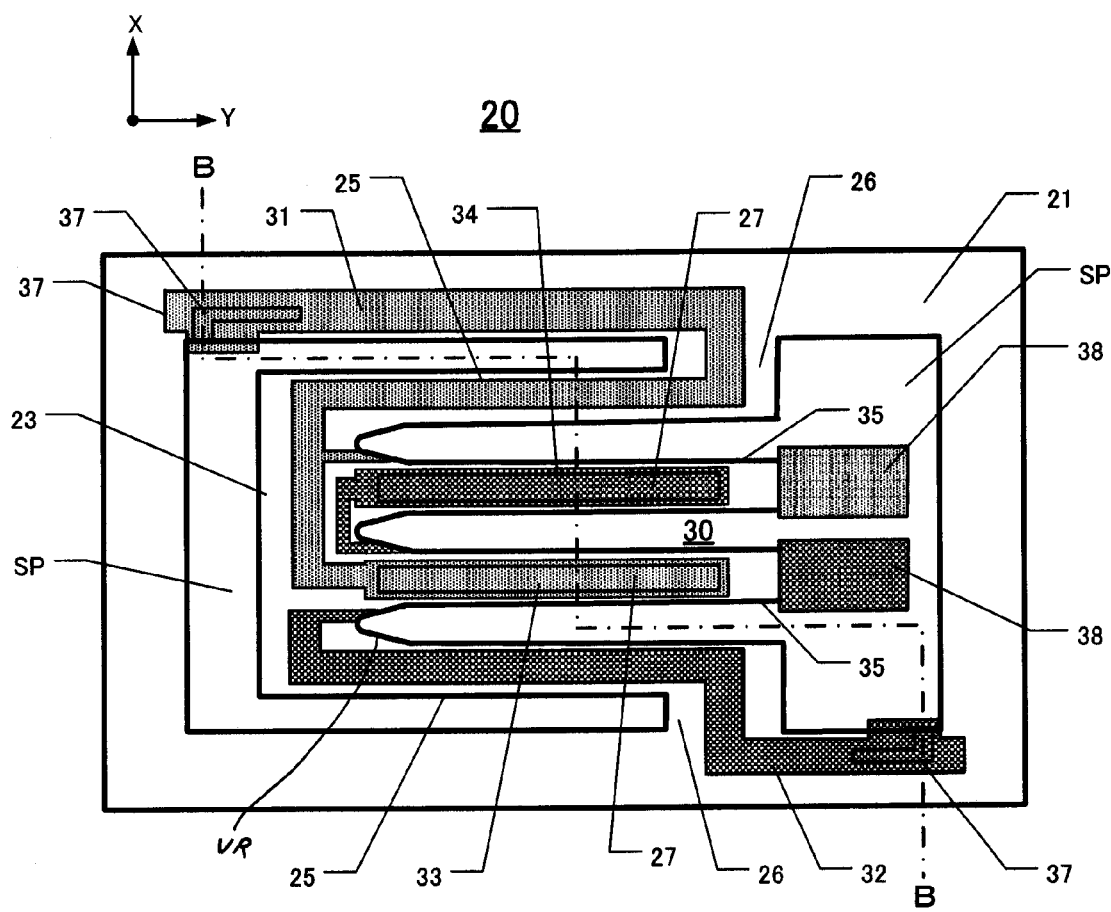
FIG. 3A is a plan view of the frame in the first embodiment.
Figure 3B:
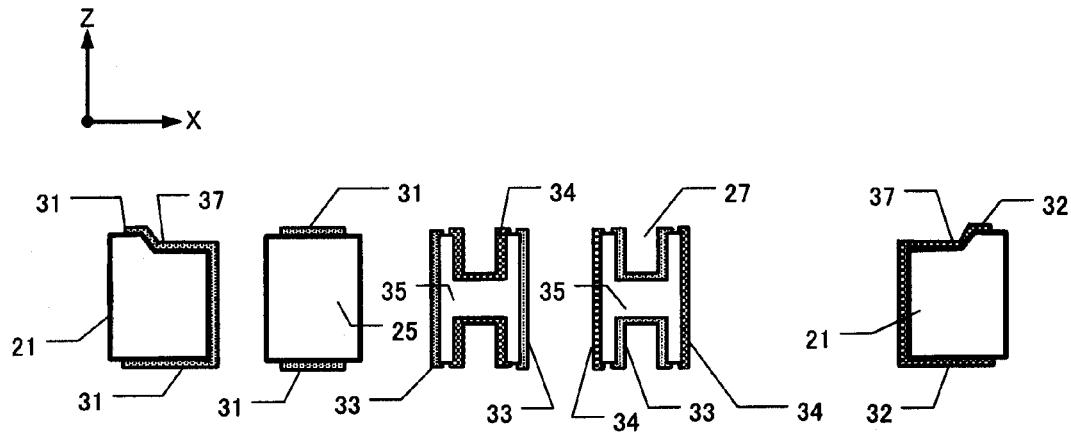
FIG. 3B is a cross-sectional view along the line B-B in FIG. 3A.

FIG. 3A is a plan (top) view of the frame 20 of this embodiment, and FIG. 3B is a cross-sectional view along the line B-B line in FIG. 3A. As FIG. 3A shows, the frame 20 comprises the tuning-fork type crystal vibrating piece 30 with its base 23, vibrating arms 35, outer frame portion 21, supporting arms 25, and connecting portions 26. These features desirably are all formed simultaneously and uniformly. The tuning-fork type crystal vibrating piece 30 is very small and oscillates at 32.768 kHz, for example.

On the outer frame portion 21, exhaust channels 37 are formed, for example, by wet-etching. The exhaust channels 37 of this embodiment are L-shaped and are located at respective positions that overlap respective through-holes TH of the package base 40. Thus, the exhaust channels 37 open to respective through-holes TH. The cross-sectional profile of an exhaust channel 37 typically is V-shaped due to the anisotropy of crystal etching.

The vibrating arms 35 extend from one end of the base 23 in the Y-direction. Grooves 27 are formed on both the upper and lower surfaces of the vibrating arms 35. The grooves 27 have respective widths that are 40% to 65% of the width of a vibrating arm, for example. In this embodiment a total of four grooves 27 is formed on the vibrating arms 35. The grooves 27 provide the vibrating arms 35 with substantially H-shaped cross-sectional profiles (FIG. 3B) that tend to reduce the CI (crystal impedance) of the tuning-fork type crystal vibrating piece 30.

The supporting arms 25 extend from one end of the base 23 in the same direction (Y direction) in which the vibrating arms 35 extend. The supporting arms 25 are connected to respective connecting portions 26, which extend to respective locations on the outer frame portion 21. The supporting arms 25 reduce oscillation leakage from the vibrating arms 35 to outside the piezoelectric device 100, and also lessen the vulnerability of the device to external temperature changes and physical impacts.

The regions at which the vibrating arms 35 and supporting arms 25 are connected to the base 23 define respective "vibrating roots" VR between the vibrating arms, and between the vibrating arms and supporting arms. Each vibrating root VR desirably is smoothly U-shaped. The vibrating arms 35 and supporting arms 25 desirably have substantially the same width in the X direction. Also, the respective spaces between the vibrating arms 35 and between each vibrating arm and respective supporting arm 25 desirably have substantially the same width in the X direction. Also, the roots VR desirably all have the same shape and are all aligned along the same X-direction line. Also, the Y-direction width of the base 23 desirably is the same at each root VR. With such features, the tuning-fork type crystal vibrating piece 30 has a bisymmetric profile after it is formed, and has a balanced left-right configuration.

On the upper, lower, and side surfaces of each vibrating arm 35 are respective first excitation electrodes 33 and second excitation electrodes 34. First extraction electrodes 31 and second extraction electrodes 32 are formed on the outer frame portion 21, the base 23, the supporting arms 25, and the connecting portion 26. Additionally, the first and second extraction electrodes 31, 32 extend to the exhaust channels 37. The first excitation electrode 33 is connected to the first extraction electrode 31, and the second excitation electrode 34 is connected to the second extraction electrode 32.

The distal tips of the vibrating arms 35 are hammer-shaped in plan view. I.e., the vibrating arms 35 terminate with ends that are wider (having a defined width) than the rest of the vibrating arms. The hammer-shaped ends include "weights" 38 made of metal film. The weights 38 cause the vibrating arms 35 to oscillate easily whenever a voltage is applied to the excitation electrodes 33, 34 on the vibrating arms 35. The weights 38 also provide stable oscillation.

One of the ends of each L-shaped exhaust channel 37 opens to the space SP defined by the frame 20. The other end extends to a location on the step 49 not occupied by the first connection electrode 42 or the second connection electrode 44, respectively. Because the first connection electrode 42 and second connection electrode 44 are not present at the respective locations, respective Z-direction gaps (corresponding to the electrode thickness) are provided at the locations. By these gaps, the through-holes TH communicate with the L-shaped exhaust channel 37 as the frame 20 is being bonded to the package base 40 (FIG. 2). The through-holes TH also communicate via these gaps with the space SP defined by the frame 20 and with the step 49 on the package base 40.

Melting of Eutectic Metal Ball

Figure 4A:
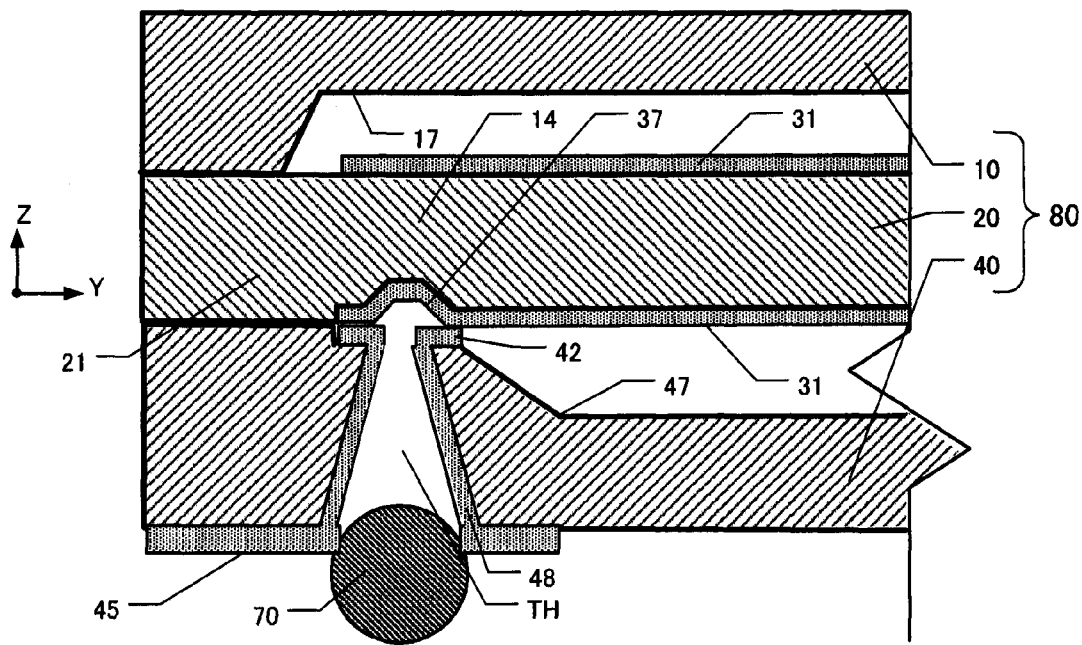
FIGS. 4A and 4B are enlarged cross-sectional views of the vicinity of the connection electrode of the first embodiment, illustrating placement and melting, respectively, of a eutectic metal ball.
Figure 4B:
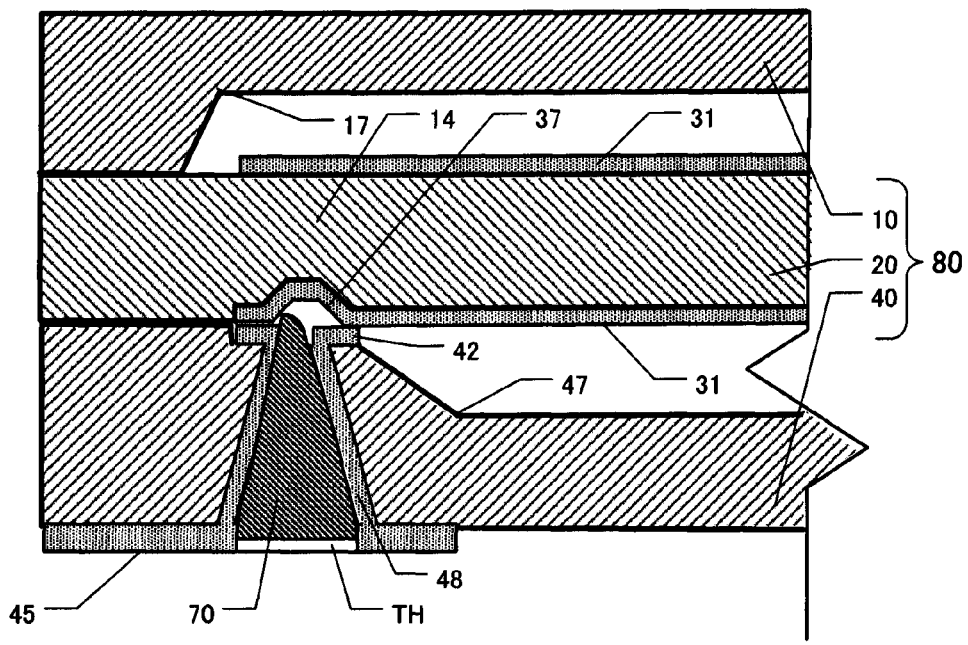

FIGS. 4A and 4B illustrate placement and melting, respectively, of the eutectic metal ball 70. These figures are enlarged cross-sectional views of the vicinity of the first connection electrode 42 after bonding together the lid 10, frame 20, and package base 40. In the actual process, the eutectic metal ball 70 is placed on the package base 40 facing upward on a respective through-hole TH. (FIGS. 4A and 4B show the package base 40 facing downward, which is a process orientation only.) Also, the second extraction electrode 32 (not shown) receives a eutectic metal ball in the same manner as the first extraction electrode 31, so the explanation below is directed to the first extraction electrode as an example.

The lid 10, frame 20, and package base 40 are bonded together by siloxane bonding performed in a normal atmosphere to form the package 80. As shown in FIG. 4A shows, in the package 80 the exhaust channel 37 defined by the frame 20 overlaps (and thus opens to) the through-hole TH in the package base 40. A eutectic metal ball 70, made of a gold-germanium (Au12Ge) alloy, for example, is placed on the through-hole TH on the under-surface of the package base 40. The package 80 on which the eutectic metal ball 70 is placed is then delivered (under-surface up) to a vacuum-reflow furnace heated to, for example, 350° C.

The transverse section of the through-hole TH has a hexagonal or other polygonal profile, rather than a round profile. Consequently, there are small gaps (not illustrated) between the surface of the eutectic metal ball 70 and certain locations around the opening of the through-hole TH. For example, small gaps will be present between the ball surface and corners of the hexagonal or other polygonal profile. Also, since the through-hole TH is connected to the L-shaped exhaust channel 37, it is in communication with the space SP inside the package. Therefore, during the time the package 80 is in the vacuum-reflow furnace, the interior of the package can be evacuated to a desired vacuum level or provided with a desired concentration of inert gas.

In the furnace, as the eutectic metal ball 70 melts, gases are released from the eutectic material. Advantageously in this embodiment, however, these gases are evacuated from inside the package 80 under the influence of vacuum-reflow so that the gases do not remain within the package 80. More specifically, the exhaust channels 37 and the positions of and particular configurations of the through-holes (especially their transverse profiles) facilitate movement of gases into and out of the package during the processes performed in the vacuum-reflow furnace. As the eutectic metal ball 70 melts, its surface remains rounded due to surface tension of the eutectic material. Upon becoming completely melted, the eutectic metal ball 70 is pushed by a tool (not shown) into the through-hole TH (FIG. 4B). The interior surface of the through-hole conductor 48 favors flow of the pushed eutectic melt along the entire through-hole conductor. That is, the interior surface of the through-hole conductor 48 enhances its wettability, even in the corners, allowing the eutectic metal to seal the through-hole TH as the melt is pushed into the through-hole. Consequently, the interior of the package 80 attains the specified degree of vacuum or specified concentration of inert gas, which yields a piezoelectric device 100 having a desired long-term stability.

As noted in this embodiment, the package 80 on which the eutectic metal balls 70 have been placed is placed in a vacuum-reflow furnace to achieve sealing of the through-holes TH while attaining a desired vacuum level inside the package. In alternative embodiments the vacuum-reflow furnace can be replaced by a reflow furnace filled with an inert gas to achieve sealing while attaining a desired inert-gas concentration inside the package. The inert gas can pass easily through the through-holes TH and exhaust grooves 37 until the eutectic melt is pushed into the through-holes.

Second Embodiment of Piezoelectric Device; Package Base and Frame

Figure 5A:
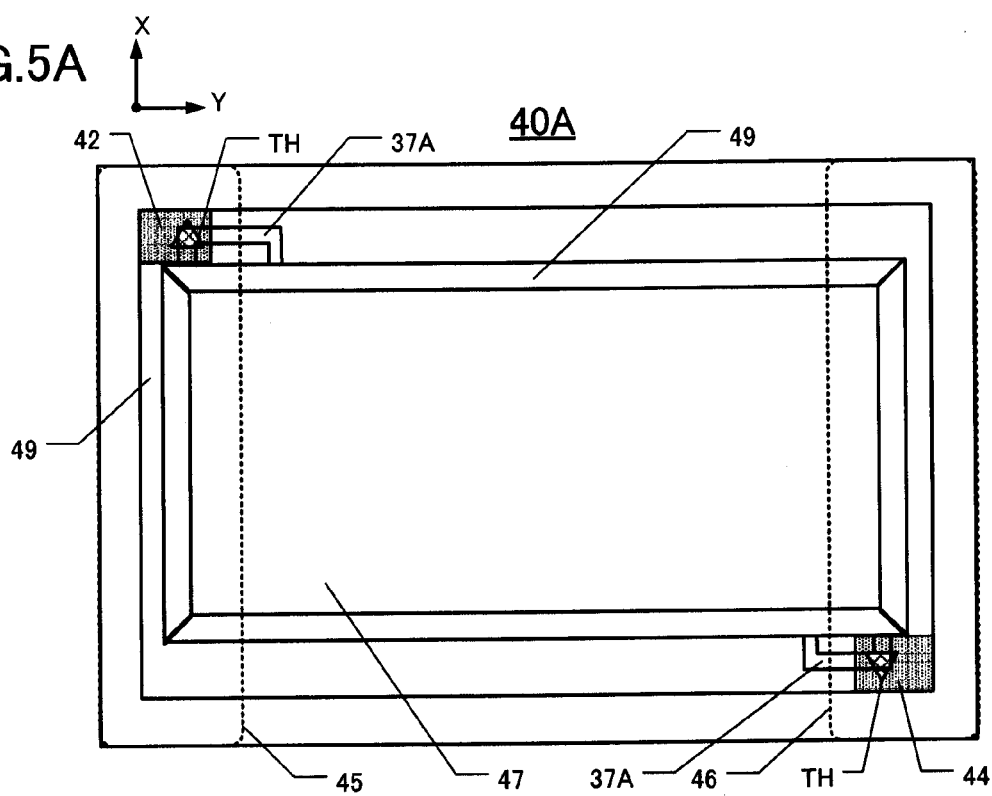
FIG. 5A is a plan view of the frame in a second embodiment of a piezoelectric device.
Figure 5B:
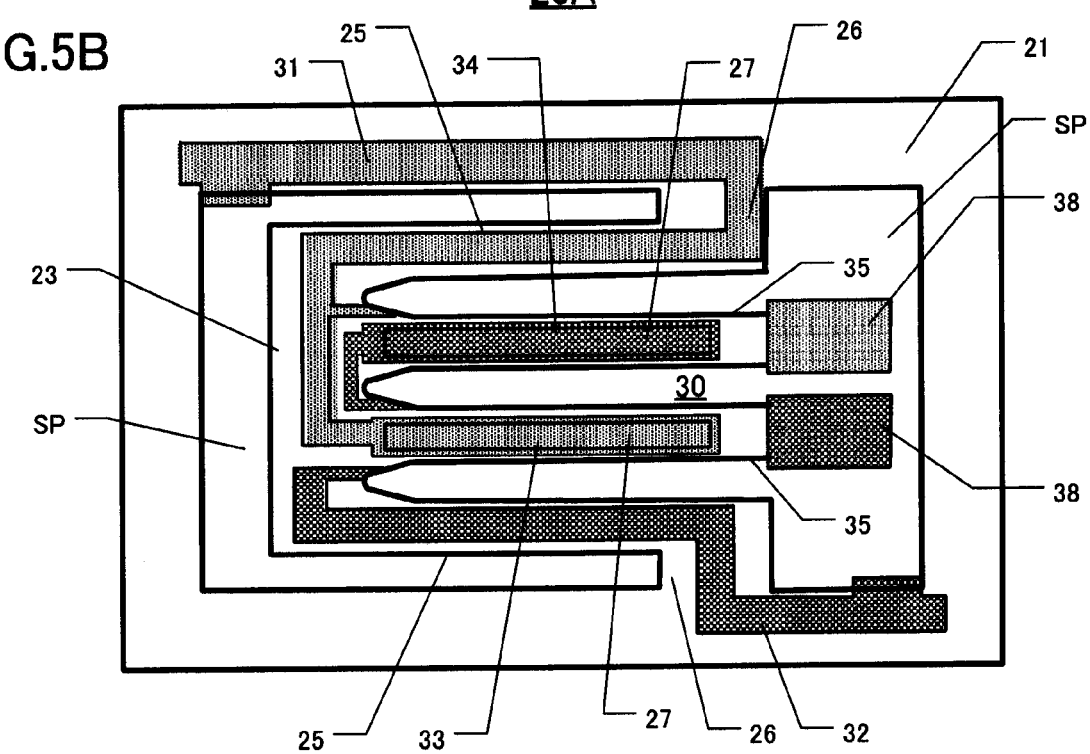
FIG. 5B is a cross-sectional view along the line B-B in FIG. 5A.

FIG. 5A is a top (plan) view of the package base 40A of this embodiment, and FIG. 5B is a plan view of the frame 20A. One difference between the first and second embodiments is that, in the second embodiment, an exhaust channel 37A is defined on the base 40A rather than on the frame 20A. I.e., the exhaust channel 37A is not formed on the frame 20A. In the description below of the second embodiment, components similar to corresponding components in the first embodiment have the same respective reference numerals, and only the differences between the two embodiments are discussed.

The step 49 in this embodiment has a depth in the range of 150 to 2000 Ångstroms, for example. In the plan view of FIG. 5A the exhaust channels 37A have a C-shape and have a depth (in the Z direction) greater than the depth of the step 49. The transverse section of the exhaust channels 37A is V-shaped due to the anisotropy of crystal etching. Both ends of the exhaust channel 37A open into the base concavity 47 and thus are in communication with the concavity. Alternatively to the C-shape in this embodiment, the exhaust channels 37A can have the same shape (L-shaped) as in the first embodiment. On the step 49 are through-holes TH extending depthwise (Z direction) to the under-surface of the package base 40A. The through-holes TH desirably are formed by wet-etching. The through-holes TH and respective exhaust channels 37A overlap each other, at least partially. Thus, the exhaust channels 37A open to (and hence are in communication with) the respective through-holes TH.

The first connection electrode 42 and second connection electrode 44 are at respective locations where a respective through-hole TH opens onto the step 49. Each through-hole TH includes a through-hole conductor 48. First and second external electrodes 45, 46 are located on the under-surface of the package base 40A.

In FIG. 5B can be seen that no exhaust channels are formed on the outer frame portion 21 of the frame 20A.

Melting of Eutectic Metal Ball 70

Figure 6:
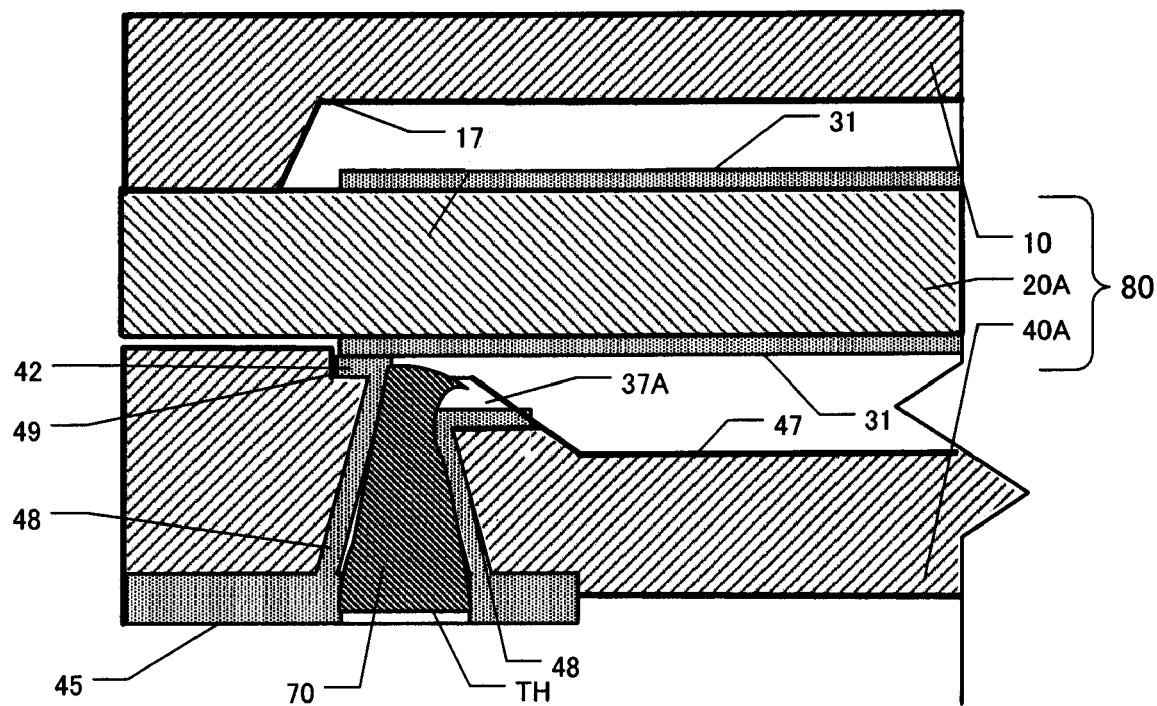
FIG. 6 is an enlarged cross-sectional view of the vicinity of the connection electrode of the second embodiment, illustrating melting of a eutectic metal ball that has been placed on a through-hole.

FIG. 6 is an enlarged partial sectional view of the vicinity of the first connection electrode 42 after the lid 10, frame 20A, and package base 40A have been bonded together. In the figure the under-surface of the package base 40A is facing downward as it normally does. The lid 10, frame 20A, and package base 40A are bonded together by siloxane bonding to form the package 80. Between the first extraction electrode 31 and first connection electrode 42 is a gap (in the Z direction) due to the exhaust channel 37A. The exhaust channel 37A overlaps the opening of the through-hole TH onto the package base 40A.

The through-hole TH has a transverse profile that is hexagonal or other polygonal shape, rather than having a round profile. Consequently, small gaps exist and are retained between the surface of the unmelted or partially melted eutectic metal ball 70 and the interior surface of the through-hole TH. Each through-hole TH is in communication with the respective C-shaped exhaust channel 37A and thus to the space SP defined by the frame 20A via the concavity 47 in the package base 40A. Therefore, whenever the package 80 is placed in a vacuum-reflow furnace in which the eutectic metal balls are melted and urged into the through-holes, the interior of the package can be evacuated readily to a desired vacuum level because gas inside the package can escape via the small gaps to outside the package.

As the eutectic metal balls 70 melt, gas is released from the eutectic material. However, these gases are readily removed by vacuum-reflow so that the gases do not enter or remain inside the package 80. During melting the surfaces of the eutectic metal balls 70 retain a rounded shape due to surface tension. After melting is complete the eutectic metal of the balls 70 is urged by a pressing tool (not shown) into the through-holes TH (FIG. 6). Thus, during sealing of the through-holes with the eutectic metal, the interior of the package 80 is evacuated to a desired vacuum level (or provided with a desired concentration of inert gas), yielding a piezoelectric device 110 exhibiting long-term stability.

Third Embodiment of Piezoelectric Device

Figure 7:
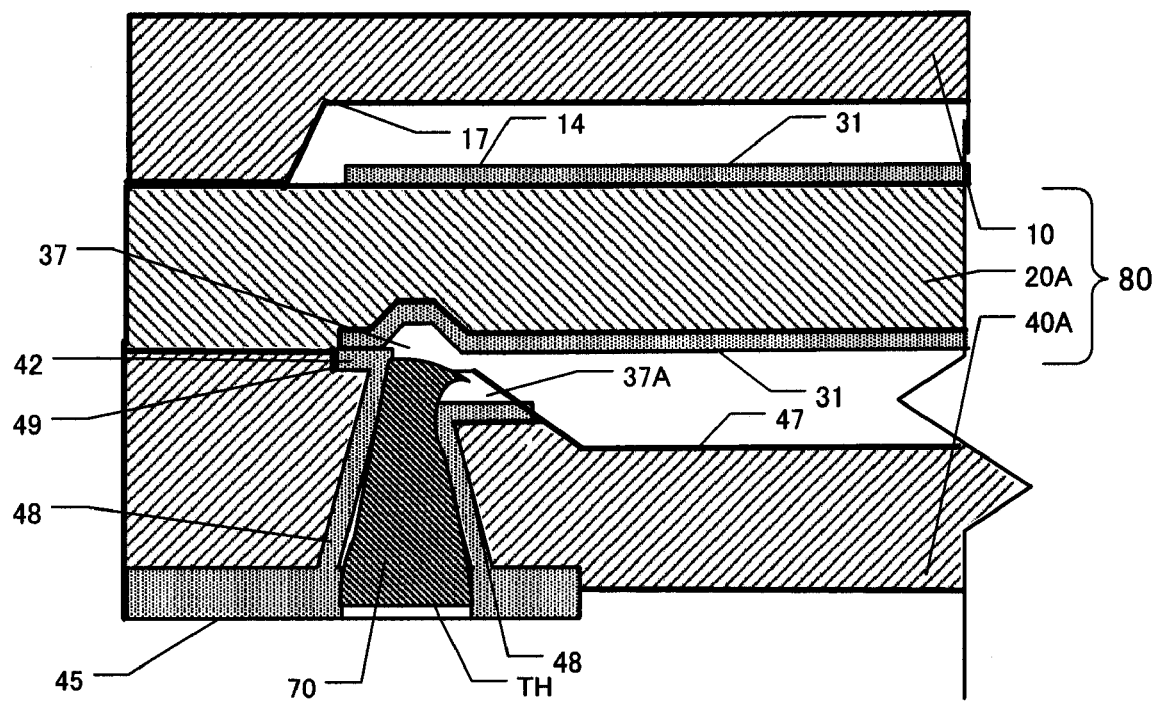
FIG. 7 is an enlarged cross-sectional view of the vicinity of the connection electrode 42 of a third embodiment of a piezoelectric device, illustrating melting of a eutectic metal ball that has been placed on a through-hole.

FIG. 7 is an enlarged sectional view of the vicinity of the first connection electrode 42 of this embodiment after the lid 10, frame 20, and package base 40A have been bonded together. A first exhaust channel 37 is defined by the frame 20, and a second exhaust channel 37A is defined by the package base 40A.

The lid 10, frame 20, and package base 40A of this embodiment are bonded together by siloxane bonding to form the package 80. As shown in FIG. 7, between the first extraction electrode 31 and first connection electrode 42 is a gap due to the presence of the exhaust channels 37, 37A. The first and second exhaust channels 37, 37A each overlap the opening of a respective through-hole TH in the package base 40A. Thus, the exhaust channels open to (and hence are in communication with) the respective through-holes TH.

Each through-hole TH is connected to respective L-shaped (as viewed in a plan view) exhaust channels 37, 37A and thus communicate with the space SP inside the package 80. These connections allow, whenever the package 80 is placed in a vacuum-reflow furnace, the interior of the package 80 to be evacuated to a desired vacuum level. The exhaust channels 37, 37A desirably have similar size and shape so as to overlap each other, thereby facilitating their communication with each other.

In the vacuum-reflow furnace the eutectic metal balls 70 placed on openings of through-holes TH of the upside-down package base 40A melt. Melting of the eutectic material releases gases from it. However, these gases are prevented by vacuum-reflow from entering or remaining inside the package 80. Upon completion of melting, the eutectic melt is pressed into the respective through-holes TH to seal them. Thus, the interior of the package 80 is provided with a desired vacuum level or inert-gas concentration, which yields a piezoelectric device 120 exhibiting long-term stability.

Multiple embodiments are described above. But, it will be understood by persons of ordinary skill in the relevant art that any of said embodiments, as well as any other embodiments within the scope of the invention, can be modified or changed. For example, although the lid desirably is made of a piezoelectric material; it can be made of a glass material instead. Also, by making the tuning-fork type piezoelectric vibrating piece 30 thinner than the thickness of its outer frame portion, concavities in the package base and lid can be eliminated, allowing a planar package base and planar lid to be used.

Furthermore, although the exhaust channel 37 is described as being L-shaped and the exhaust channel 37A is described as being C-shaped, any of various other shapes can be used. For example, an exhaust channel can be I-shaped or can have any other practical shape ensuring communication of the exhaust channel via the through-holes TH and the space SP.

What is claimed is:

1. A piezoelectric device, comprising:
   a frame made of a piezoelectric material and comprising a vibrating piece connected to an outer frame portion that surrounds the vibrating piece, the vibrating piece including at least one excitation electrode, and the outer frame portion having a first surface and a second surface and including a respective extraction electrode connected to each excitation electrode;
   a package base having an interior surface and an external surface, the interior surface being bonded to the first surface of the outer frame portion, the package base including a respective connection electrode connected to each extraction electrode, a respective external terminal on the external surface, and a respective through-hole extending from the interior surface to the external surface, the through-hole including a conductor connecting the respective connection electrode to the respective external terminal; and
   a lid having an exterior surface and an internal surface, the interior surface being bonded to the second surface of the piezoelectric frame;
   wherein the piezoelectric frame defines a respective exhaust channel on each extraction electrode adjacent the respective through-hole conductor.

2. The piezoelectric device of claim 1, wherein each excitation electrode, extraction electrode, and connection electrode comprises a gold (Au) layer on a foundation layer comprising chrome or nickel.

3. The piezoelectric device of claim 1, wherein the lid is made of a material comprising a piezoelectric or glass material.

4. The piezoelectric device of claim 1, wherein the first exhaust channels open to space between the vibrating piece and the outer frame portion.

5. The piezoelectric device of claim 4, wherein each excitation electrode, extraction electrode, and connection electrode comprises a gold (Au) layer on a foundation layer comprising chrome or nickel.

6. The piezoelectric device of claim 4, wherein the lid is made of a material comprising a piezoelectric material or glass material.

7. The piezoelectric device of claim 4, wherein:
the connection electrodes are formed on a step defined on the interior surface of the package base, the step being surrounded by a mounting surface of the package base;
the step has a lower elevation than the mounting surface of the package base; and
the first exhaust channels open onto respective regions of the step not occupied by the connection electrodes.

8. The piezoelectric device of claim 7, wherein each of the excitation electrodes, extraction electrodes, and connection electrodes comprised of a gold (Au) layer formed on a foundation layer comprising chrome or nickel.

9. The piezoelectric device of claim 7, wherein the lid is made of a material comprising a piezoelectric material or glass material.

10. The piezoelectric device of claim 1, wherein:
the connection electrodes are formed on a step defined on the interior surface of the package base, the step being surrounded by a mounting surface of the package base;
the step has a lower elevation than the mounting surface of the package base; and
the first exhaust channels open onto respective regions of the step not occupied by the connection electrodes.

11. The piezoelectric device of claim 10, wherein the excitation electrode, the extraction electrode, and the connection electrode each comprise a gold (Au) layer formed on a foundation layer comprising chrome or nickel.

12. The piezoelectric device of claim 10, wherein the lid comprises a material comprising a piezoelectric material or glass material.

13. A piezoelectric device, comprising:
a piezoelectric frame comprising a piezoelectric vibrating piece including an excitation electrode, an outer frame portion surrounding the vibrating piece, and an extraction electrode connected to the excitation electrode, the piezoelectric frame having a first surface and a second surface;
a package base having an interior-facing surface bonded to the first surface of the piezoelectric frame and comprising (a) a connection electrode connected to the extraction electrode, and (b) an exterior-facing surface including an exterior terminal connected to the connection electrode, the package base defining a through-hole containing a conductor connecting the connection electrode to the exterior terminal;
a lid bonded to the second surface of the piezoelectric frame; and
a channel opening to the extraction electrode and in communication with the through-hole.

14. The piezoelectric device of claim 13, wherein the lid is made of a material comprising a piezoelectric material or a glass material.

15. The piezoelectric device of claim 13, wherein the interior-facing surface of the package base defines a concavity preventing contact of the piezoelectric vibrating piece with the package base; and
the channel is in communication with space in the concavity.

16. The piezoelectric device of claim 15, wherein the lid is made of a material comprising a piezoelectric material or glass material.

17. The piezoelectric device of claim 16, wherein the excitation electrode, extraction electrode, and connection electrode are each made of a material comprising a gold (Au) layer formed on a foundation layer comprising chrome or nickel.

18. The piezoelectric device of claim 15, wherein the excitation electrode, extraction electrode, and connection electrode are each made of a material comprising a gold (Au) layer formed on a foundation layer comprising chrome or nickel.

19. A piezoelectric device, comprising:
a piezoelectric frame comprising a vibrating piece on which an excitation electrode is formed and an outer frame portion surrounding the vibrating piece, the outer frame portion including an extraction electrode connected to the excitation electrode;
a package base bonded to one surface of the piezoelectric frame, the package base including (a) a connection electrode formed on an interior-facing surface of the base and connected to the extraction electrode, (b) an external terminal formed on an exterior-facing surface of the base opposite the interior-facing surface, a through-hole extending from the exterior-facing surface to the interior-facing surface, and (d) a through-hole conductor extending through the through-hole and connecting the connection electrode to the external terminal;
a lid bonded to a second surface, opposite the one surface, of the piezoelectric frame; and
a channel having first and second portions, the first portion opening to the extraction electrode adjacent the through-hole conductor, and the second portion being in communication with the connection electrode connected to the through-hole conductor.

20. The piezoelectric device of claim 19, wherein the excitation electrode, the extraction electrode, and the connection electrode are each made of a material comprising a gold (Au) layer formed on a foundation layer comprising chrome or nickel.

* * * * *